United States Patent [19]
Reiffin

[11] Patent Number: 5,859,565
[45] Date of Patent: Jan. 12, 1999

[54] CATHODE-FOLLOWER HIGH-FIDELITY POWER AMPLIFIER

[76] Inventor: Martin Reiffin, 5439 Blackhawk Dr., Danville, Calif. 94506

[21] Appl. No.: 814,805

[22] Filed: Mar. 10, 1997

[51] Int. Cl.$^6$ ........................................................ H03F 3/50
[52] U.S. Cl. ................................ 330/71; 330/88; 330/94; 330/119
[58] Field of Search .................................. 330/70, 71, 73, 330/74, 88, 94, 119, 122, 311

[56] References Cited

U.S. PATENT DOCUMENTS

| | | | |
|---|---|---|---|
| 2,955,261 | 10/1960 | Edwards | 330/119 X |
| 4,647,872 | 3/1987 | Johnson | 330/311 |

*Primary Examiner*—James B. Mullins

[57] ABSTRACT

A cathode-follower power output stage is driven by a novel drive stage to provide with low distortion the large signal required to drive the output stage. The drive stage comprises two series connected vacuum tubes which share the large static and dynamic voltages of the drive stage so as to provide a drive signal having a large voltage swing, without generating audible distortion and without subjecting the drive stage tubes to excessively high voltages. The plate of a first drive tube is connected to the cathode of the second drive tube. A load impedance is connected from a B+ power supply terminal to the plate of the second drive tube. The grid of the second drive tube is driven by a signal responsive voltage divider network driven by the plate of the second drive tube. The voltage divider network maintains the grid of the second drive tube at a voltage approximately midway between the voltage of the second drive tube plate and the ground as the plate voltage swings in response to the signal current flowing through the load impedance. The two series connected drive tubes thereby share approximately equally both the quiescent static voltage and the dynamic output voltage of the drive stage as the latter drives the grid of the cathode-follower output stage with the required large amplitude voltage swings.

20 Claims, 7 Drawing Sheets

CATHODE-FOLLOWER HIGH-FIDELITY POWER AMPLIFIER

I. BACKGROUND OF THE INVENTION

(1) Field of the Invention

This invention relates to high-fidelity vacuum-tube audio power amplifiers for driving a loudspeaker to provide music reproduction without audible distortion, and more particularly, to an amplifier having a cathode-follower output stage requiring a large drive voltage swing provided by a novel series-connected drive stage.

(2) Brief Description of the Related Prior Art

In the past decade of the art of high-end audio reproduction it has come to be recognized by many audiophiles and amplifier designers that vacuum-tube amplifiers provide superior music reproduction as compared with transistor amplifiers. These tube amplifiers generally have output stage configurations which are either push-pull or single-ended.

Both the single-ended output stage and the push-pull output stage operate in the common-cathode mode which has numerous disadvantages, primarily due to the relatively large magnitude of the tube plate resistance. As explained in more detail below, these disadvantages include the need for a large air gap in the single-ended transformer core to prevent saturation thereby reducing the transformer primary inductance and increasing the distortion due to the resulting steep elliptical loadline traversed by the tube operating point. Further, the high source impedance, inherent in the common-cathode mode, also increases the distortion due to the nonlinear magnetization current of the transformer core. It also results in a high amplifier output impedance at the speaker terminals thereby providing a low amplifier damping factor and poor speaker transient response. A further disadvantage of the high source impedance of the output stage is the resulting frequency response nonlinearity when driving typical speakers which have an impedance which varies with frequency. In addition, the high source impedance of the plate resistance coacts with the leakage inductance and winding capacitance of the output transformer to generate phase shift and rolloff at high frequencies. The common-cathode mode also results in a high Miller-effect capacitance at the input of the output stage.

In a push-pull configuration, the high source impedance due to the plate resistance exacerbates the inevitable dynamic and static imbalances of a push-pull output stage accompanying the aging of the output tubes with use over time, and also those imbalances due to asymmetrical drive signals transmitted to the two halves of the push-pull stages.

These disadvantages of the common-cathode output stage are further explained in the detailed description of the prior art set forth below. It is well-known in the prior art that a lower output impedance and reduced distortion in the output stage itself can be obtained by utilizing a cathode-follower mode of operation for the output configuration. However, this has heretofore been impractical because the cathode-follower output stage requires a very large drive signal so that the preceding conventional drive stage would have generated as much or more distortion than would have been reduced by the cathode-follower output mode. Also, the large supply voltage required for the drive stage would have subjected the drive stage tube to an excessively high plate-to-cathode voltage.

II. SUMMARY OF THE INVENTION

The present invention implements a cathode-follower output stage to obviate the above-noted disadvantages of the common-cathode output stage, in combination with a novel drive stage to provide the required large drive signal. This novel drive stage comprises two series connected tubes which share the large static and dynamic voltages of the drive stage so as to provide with low distortion the large voltage signal required to drive the cathode-follower output stage, and without subjecting the drive stage tubes to excessively high voltages.

More particularly, the novel drive stage comprises at least two vacuum-tube triodes connected in series with the plate of a first drive tube connected to the cathode of the second drive tube. A load impedance is connected from a B+ power supply terminal to the plate of the second drive tube. The plate of the second drive tube constitutes the output node of the drive stage and is connected to the grid of the cathode-follower output stage to drive the latter. The grid of the first drive tube constitutes the input node of the drive stage and is driven by a previous stage. The grid of the second drive tube is driven by a signal responsive voltage divider network driven by the plate of the second tube.

The voltage divider network maintains the grid of the second drive tube at a voltage approximately midway between the voltage of the second drive tube plate and the ground as said plate voltage swings in response to the signal current flowing through the load impedance. As a result, the voltage of the second drive tube cathode and the first drive tube plate is also maintained approximately midway between the voltage of the second drive tube plate and ground. That is, the two series connected drive tubes share approximately equally both the quiescent static voltage and the dynamic output voltage of the drive stage as the latter drives the grid of the cathode-follower output stage with the required large amplitude voltage swings.

III. BRIEF DESCRIPTION OF THE DRAWINGS

IV. DETAILED DESCRIPTION OF THE PRIOR ART

Figure 5:
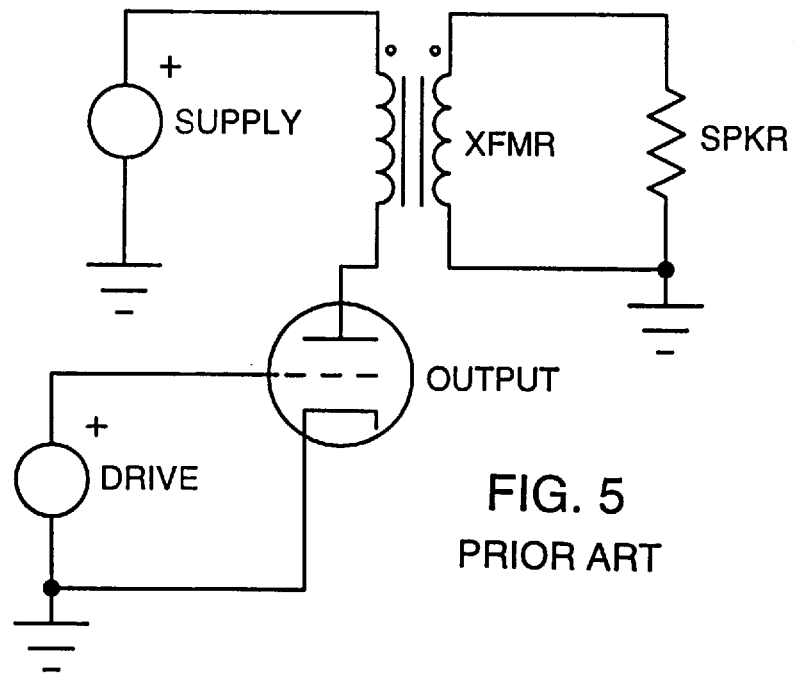
FIG. 5 is a simplified circuit diagram showing a common-cathode single-ended output stage in accordance with the prior art.

The advantages of the present invention may be best understood by first considering in more detail the problems and disadvantages of the conventional common-cathode output stage configuration of the prior art. FIG. 5 of the drawings shows a conventional single-ended output stage. The output tube designated OUTPUT is generally a power triode having its cathode grounded, its grid driven by a previous drive stage indicated by the voltage symbol designated DRIVE, and its plate connected to one end of the primary winding of an output transformer designated XFMR. The opposite end of the transformer primary winding is connected to a B+ power supply indicated by a voltage symbol designated SUPPLY. The transformer secondary winding is connected to the loudspeaker load designated SPKR.

Figure 6:
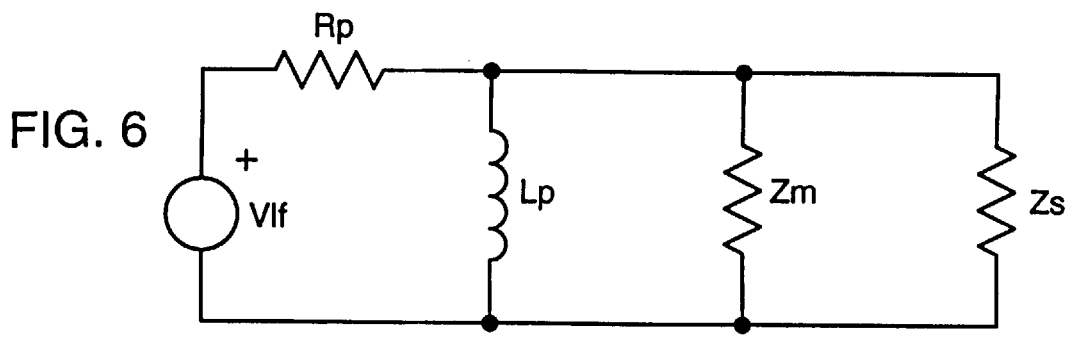
FIG. 6 is a simplified equivalent circuit of a tube output stage and output transformer at low frequencies.
Figure 7:
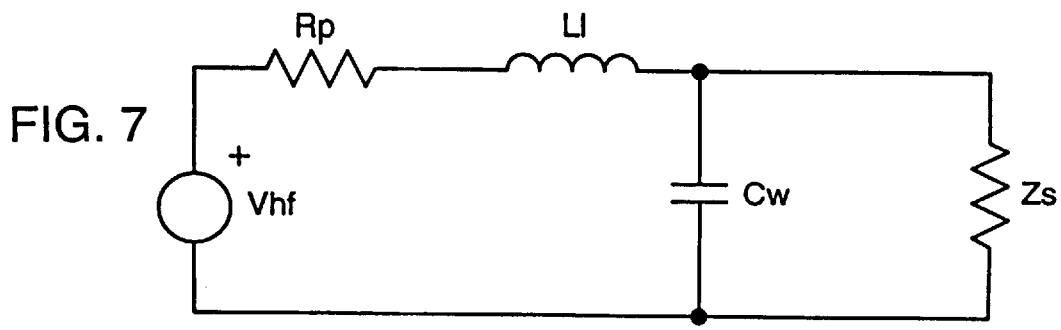
FIG. 7 is a simplified equivalent circuit of a tube output stage and output transformer at high frequencies.

This prior art single-ended output stage operates in the common-cathode mode which has numerous disadvantages. Several of these will be explained with reference to FIG. 6 of the drawings which shows a simplified equivalent circuit of the transformer at low frequencies, and with reference to FIG. 7 which shows an equivalent circuit at high frequencies. Referring first to FIG. 6, Vlf designates a low-frequency voltage source provided by an output tube (not shown). Rp represents the dynamic plate resistance of the output tube connected in the common-cathode mode. The open-circuit primary inductance of the output transformer is designated Lp. The core loss due to magnetic hysteresis and eddy currents in the transformer is designated by Zm. The loudspeaker impedance, reflected to the primary, is designated Zs. Most of the disadvantages of this common-cathode topology are due to the relatively large magnitude of the plate resistance Rp. In FIG. 7, Vhf designates a high-frequency voltage source provided by the output tube. Rp is again the plate resistance of the tube. Li symbolizes the transformer leakage inductance. Cw designates the transformer winding capacitance. Zs again refers to the reflected speaker impedance. The disadvantages arising from the high plate resistance Rp are as follows:

First, in a single-ended output stage configuration the quiescent plate-to-cathode current flows through the output transformer primary winding and is not balanced by an oppositely flowing current as in a properly biased push-pull output stage. This requires a relatively large air gap in the transformer core in order to prevent saturation of the core. The resulting increased reluctance of the core substantially reduces the transformer primary inductance which presents the output tube with a reactive low-impedance load at low frequencies. This causes the operating point of the tube to follow an elliptical loadline having a steep major axis, thereby increasing the distortion of the signal output at the plate. This distortion is exacerbated by the large plate resistance Rp because it provides a relatively high driving source impedance as seen by the primary inductance Lp. The reactive load is further disadvantageous in that at low frequencies it causes phase shift which reduces the feedback stability margin and prevents the use of substantial amounts of negative feedback, thereby further increasing the distortion of the amplifier. In a push-pull implementation the same problem exists to a lesser extent. That is, the bias currents of the output tubes eventually become unbalanced with use as the tubes age over time. This requires an air gap in the core, albeit smaller than the gap required for a single-ended topology.

Second, the high source impedance due to plate resistance Rp also increases the distortion due to the nonlinear magnetization current of the transformer core, as explained in the papers by Partridge (Ref. 1) and Hodgson (Ref. 2) in the bibliography at the end of this specification. That is, the nonlinear magnetization current results in a nonlinear voltage drop across plate resistance Rp which voltage drop, when subtracted in series from the linear source voltage Vlf, provides a nonlinear voltage to the primary winding of the transformer.

Third, the high source impedance due to the plate resistance Rp results in a high amplifier output impedance at the speaker terminals. This in turn results in a low amplifier damping factor and poor transient response, and also frequency response nonlinearity when driving typical speakers which have an impedance which varies with frequency.

Fourth, the high source impedance of the plate resistance Rp coacts with the leakage inductance Li and winding capacitance Cw to produce a high-frequency rolloff, and also to produce a phase shift at high frequencies, thereby reducing the high-frequency feedback stability margin and further limiting the amount of feedback that may be utilized to reduce distortion of the amplifier.

Fifth, the common-cathode mode results in a high input capacitance due to the Miller effect, thereby increasing the load on the previous drive stage, and also increasing the high-frequency phase shift so as to reduce further the high-frequency feedback stability margin of the amplifier.

Sixth, the high source impedance Rp exacerbates the inevitable dynamic and static imbalances of a push-pull output stage due to said aging of the output tubes with use over time, and also those imbalances due to asymmetrical drive signals transmitted to the two halves of the push-pull stages.

Several of the above-described disadvantages of the common-cathode output stage are explained in more detail at Pages 214–217 and 229–233 of the *Radiotron Designer's Handbook* (Ref. 3).

It is well-known in the prior art that a lower output impedance and reduced distortion in the output stage can be obtained with a cathode-follower configuration. That is, instead of the output transformer primary winding being connected in series between the power supply B+ terminal and the output tube plate as implemented in the usual common-cathode topology, the transformer winding is connected in series between the output cathode and the ground. Such a cathode-follower output stage is show by Gilson and Pavlat (Ref. 4) who utilize this configuration in order to reduce the amplifier output impedance and thereby increase the amplifier damping factor for better control over the speaker cone movement. It is also well-known in the prior art that the cathode-follower mode provides low distortion when used in drive stages, as noted at Page 596 of the *Radiotron Designer's Handbook* (Ref. 3). However, for output stages the latter fererence also accurately states:

"Cathode-follower output stages introduce serious problems, and are not suitable for general use, even though their low plate resistance and low distortion appear attractive. The difficulty is in the high input voltage which is beyond the capabilities of a resistance-coupled [penultimate drive] stage operating on the same plate supply voltage."

This page of the Radiotron reference further states that the Gilson et al. (Ref. 4) cathode-follower amplifier is seriously flawed because:

". . . the total harmonic distortion at 50 c/s is over 1% at 8 watts output, and 1.7% at 20 watts. The high output voltage which must be delivered by the resistance-coupled penultimate stage thus show its effect on the distortion, even though the supply voltage has been increased to a dangerously high value [700 volts]."

As stated by Crowhurst (Ref. 5):

"Full cathode-follower operation in either of the three major circuits is not generally used in practice because it is as difficult to obtain (without distortion) the very large drive voltages required as to design the output stage itself with low distortion."

V. DESCRIPTION OF THE PREFERRED EMBODIMENTS

Figure 1:
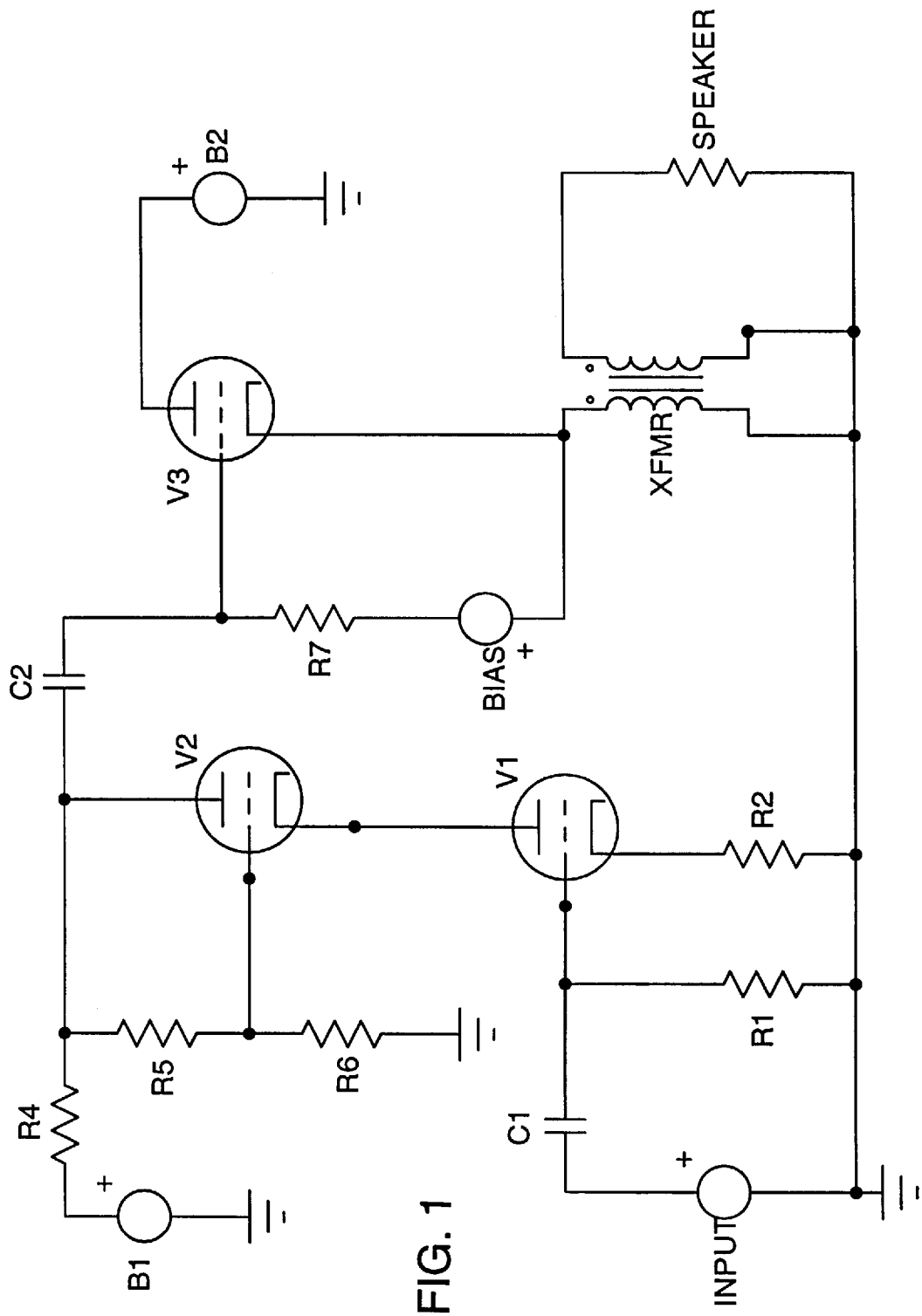
FIG. 1 is a circuit diagram showing the novel drive stage and the fixed-bias cathode-follower output stage of a single-ended amplifier circuit in accordance with the present invention.

Referring first to FIG. 1, the triodes V1 and V2 constitute a drive stage for driving a single-ended cathode-follower output stage comprising a power triode V3. The plate of the first drive stage triode V1 is connected to the cathode of the second drive stage triode V2. The audio signal to be amplified is provided by previous input and/or predrive stages represented by the symbol INPUT and is transmitted through coupling capacitor C1 to the grid of the first drive stage triode V1. A grid resistor R1 is connected between said first drive stage triode grid and ground. A cathode bias resistor R2 is connected between the cathode of triode V1 and ground.

A load resistor R4 extends from a first direct-current power supply terminal B1 to the plate of the second drive stage triode V2. The grid of the latter is driven by a voltage-divider network comprising resistors R5 and R6. Resistor R5 extends from the plate of drive stage triode V2 to the grid of the latter. Resistor R6 extends from said grid of drive stage triode V2 to ground.

A second coupling capacitor C2 transmits the drive stage output signal at the plate of triode V2 to the grid of the output stage triode V3. A fixed negative bias voltage designated BIAS is applied to the grid of output stage triode V3 through resistor R7. A second direct current power supply terminal B2 is connected to the plate of output stage triode V3. The cathode of the latter is connected to one end of the primary winding of an output transformer XFMR and the other end of the primary winding is connected to ground. A secondary winding of output transformer XFMR is connected across a loudspeaker symbolized by the resistor designated SPEAKER.

The driving source impedance at the cathode of the cathode-follower output triode V3 is substantially lower than that at the plate of a conventional common-cathode output triode. As a result the nonlinear distortion and low-frequency phase shift are substantially reduced. The low source impedance of the cathode follower mode substantially reduces the distortion due to the nonlinear magnetization current of the transformer core. The low source impedance results in a low amplifier output impedance at the speaker terminals. This in turn results in a high amplifier damping factor and improved transient response. The frequency response is more linear when driving typical speakers which have an impedance which varies with frequency. The low source impedance of the output triode V3 coacts with the leakage inductance Li and winding capacitance Cw to produce a rolloff at a higher frequency, and also to reduce the phase shift at high frequencies, thereby increasing the high-frequency feedback stability margin. The cathode-follower mode results in a high input impedance, thereby reducing the load on the previous predrive stage, and also reducing the high-frequency phase shift so as to increase further the high-frequency feedback stability margin of the amplifier.

These advantages of the cathode-follower output configuration are made feasible by the novel drive stage V1, V2 which provides the large voltage drive swing required by the cathode-follower output stage, without excessive distortion in the drive stage and without excessive plate supply voltage for each drive tube. That is, by enabling a plurality of triodes to share both the quiescent voltage and the dynamic swing voltage, both the voltage swing and the quiescent plate voltage for each individual triode are reduced by about one-half. The reduced voltage swing of each triode provides for substantially reduced distortion.

Figure 2:
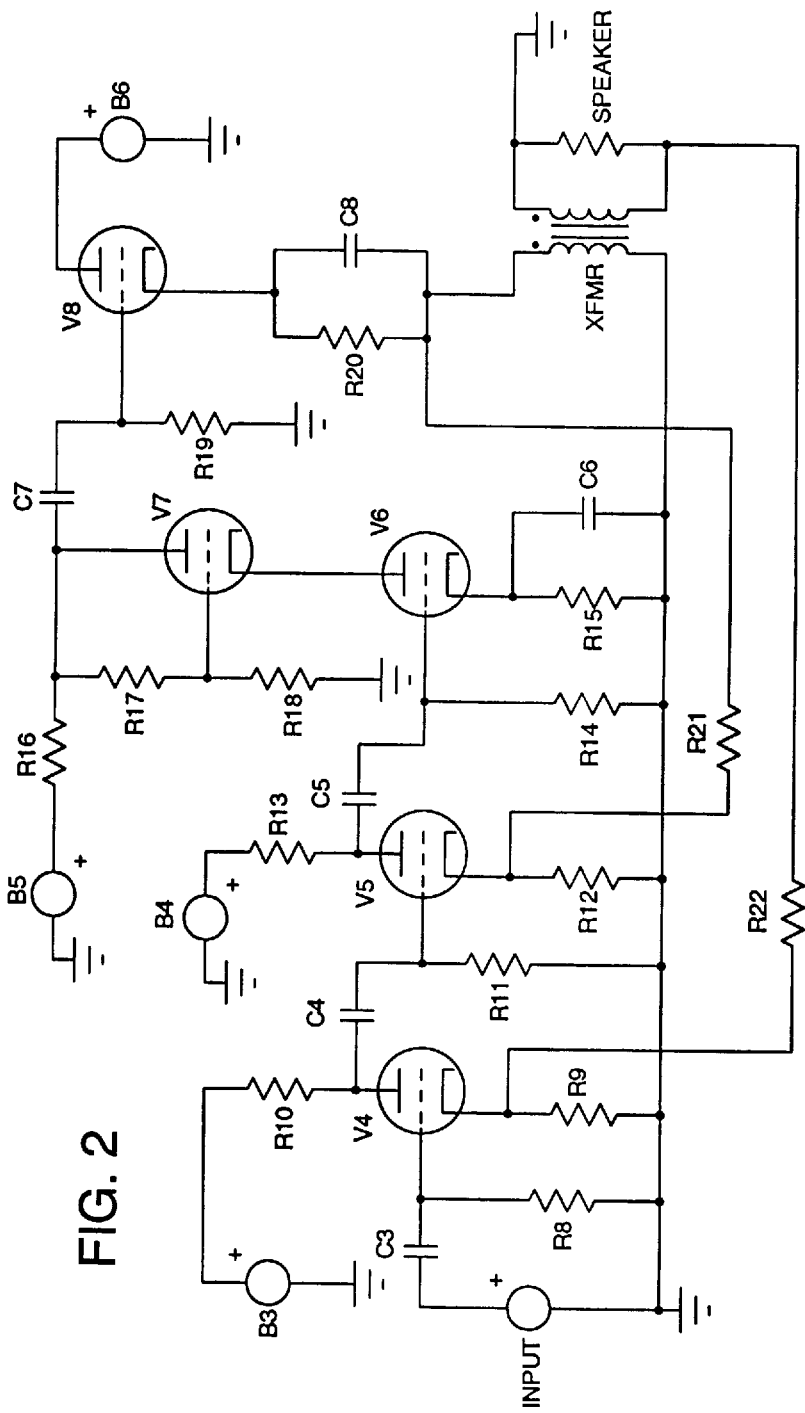
FIG. 2 is a circuit diagram showing the novel drive stage and a self-biased cathode-follower output stage, together with an input stage, a pre-drive stage, and both inner and outer negative feedback networks.

Referring now to FIG. 2, there is shown circuit diagram comprising drive stage triodes V6, V7, a self-biased cathode-follower output stage triode V8, an input stage triode V4, a pre-drive stage triode V5, an inner negative feedback network resistor R21, and an outer negative feedback network resistor R22. The audio input signal to be amplified is designated by the symbol INPUT and is transmitted to the grid of input stage triode V4 by coupling capacitor C3. A grid resistor R8 extends from said grid to ground. The cathode of input stage triode V4 is connected to one end of cathode resistor R9 having its opposite grounded. A load resistor R10 is connected between the plate of input stage triode V4 and a first direct current power supply terminal B3.

A coupling capacitor C4 transmits the signal at the plate of input stage triode V4 to the grid of the predrive stage triode V5. The cathode of the latter is connected to ground by the cathode resistor R12. The plate of predrive stage triode V5 is connected to a second direct current power supply terminal B4 through a plate load resistor R13.

The drive stage comprising triodes V6, V7 is similar to the drive stage V1, V2 described above with respect to FIG. 1, except that if desired the cathode resistor R15 of V6 in FIG. 2 may be paralleled by a bypass capacitor C6 as shown. The signal at the plate of predrive stage triode V5 is transmitted to the grid of the first drive stage triode V6. The grid of the latter is connected to ground by a grid leak resistor R14. The plate of the first drive stage triode V6 is connected to the cathode of the second triode V7. A voltage divider network comprises resistors R17, R18 extending in series from the plate of the second drive triode V7 to ground, with the junction of the resistors connected to the grid of the second drive triode V7. A load resistor R16 extends from a third direct current power supply terminal B5 to the plate of the second drive triode V7.

A coupling capacitor C7 transmits the signal at the plate of the second drive triode V7 to the grid of the output stage triode V8. A grid leak resistor R19 extends from said grid to ground. The plate of the output triode V8 is connected to a fourth direct current power supply terminal B6. The output triode V8 is self-biased by a cathode resistor R20 bypassed by a capacitor C8, both extending to one end of the primary of an output transformer XMFR having its opposite end grounded. The secondary of the output transformer XFMR is connected across the loudspeaker symbolized by the resistor designated SPEAKER. The upper end of the transformer secondary winding is shown grounded, and the opposite lower end of the secondary winding is connected to one end of an outer negative feedback network designated by resistor R22. The opposite end of the feedback network R22 is connected to the cathode of input stage triode V4 to provide an overall negative feedback loop with the well-known advantages of the latter. An inner negative feedback network R21 extends from the primary winding of output transformer XFMR to the cathode of predrive stage triode V5, so as to further reduce any residual distortion due to the large voltage swing of the drive stage V6, V7 and the power output triode V8. The inner feedback network R21 is further advantageous in that it reduces the phase shift and redistributes the transfer function poles of the cascade circuit of predrive, drive and output stages, and thereby increases the stability margins of the overall feedback loop provided by feedback network R22. The feedback network R21 is shown indirectly connected to the cathode of output tube V8, but may instead be directly connected thereto.

Figure 3:
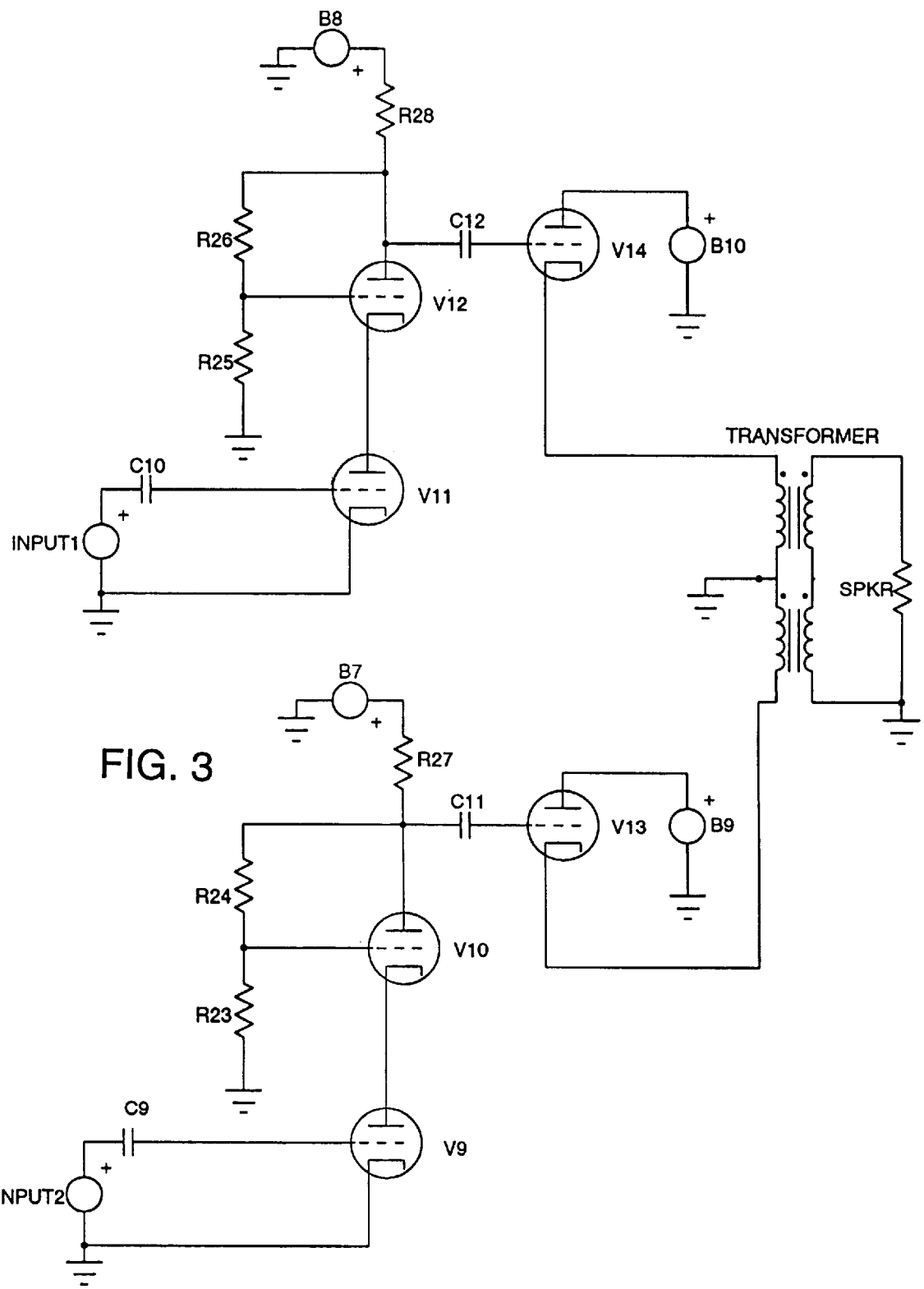
FIG. 3 is a circuit diagram showing a push-pull cathode-follower output stage with each half of the stage driven by a respective one of a pair of the novel drive stages in accordance with the invention.

Referring now to FIG. 3, there is shown a circuit diagram of a push-pull cathode-follower output stage with each half of the stage driven by a respective one of a pair of the above-described novel drive stages of the present invention. The output stage comprises a pair of power triodes V13, V14 having their respective ends connected to the opposite ends of the primary winding of a push-pull output transformer. The primary winding has a center-tap connected to ground. The transformer also has a secondary winding connected across a loudspeaker symbolized by a resistor designated SPKR having one terminal connected to ground.

The plate of output triode V13 is connected to a first positive power supply terminal B9 and the plate of output triode V14 is similarly connected to a second positive power supply terminal B10. The grid of output triode V13 is driven by the signal at the plate of drive triode V10 transmitted by a first coupling capacitor C1. The grid of output triode V14 is similarly driven by the signal at the plate of drive triode V12 transmitted by a second coupling capacitor C12. These two drive signals are oppositely phased so that when one of the output triodes V13, V14 "pulls" the other output triode "pushes".

Connected in series with the cathode of drive triode V10 is the plate of drive triode V10, and connected in series with the cathode of drive triode V12 is the plate of drive triode V11. The respective cathodes of drive triodes V9, V11 are connected to ground in the conventional manner through cathode resistors (not shown). The plate of drive triode V10 is connected to one end of a first load resistor R27 having its opposite end connected to a third positive power supply terminal B7. The plate of drive triode V12 is similarly connected to one end of a second load resistor R28 having its opposite end connected to a fourth positive power supply terminal B8.

The drive triode V10 is driven by a voltage divider network comprising series connected resistors R23, R24. Resistor 24 has one end connected to the plate of drive triode V10 and its opposite end connected to the grid of the latter. Resistor 23 extends from said grid to ground. Similarly, the drive triode V12 is driven by a voltage divider network comprising series connected resistors R25, R26. Resistor 26 has one end connected to the plate of drive triode V12 and its opposite end connected to the grid of the latter. Resistor 25 extends from said grid to ground. The grids of drive triodes V9, V11 are driven by oppositely phased signals transmitted through respective coupling capacitors C9, C10 from conventional input and phase-splitter stages indicated in FIG. 3 by the symbols INPUT1, INPUT2 and shown in detail in FIG. 4.

Figure 4:
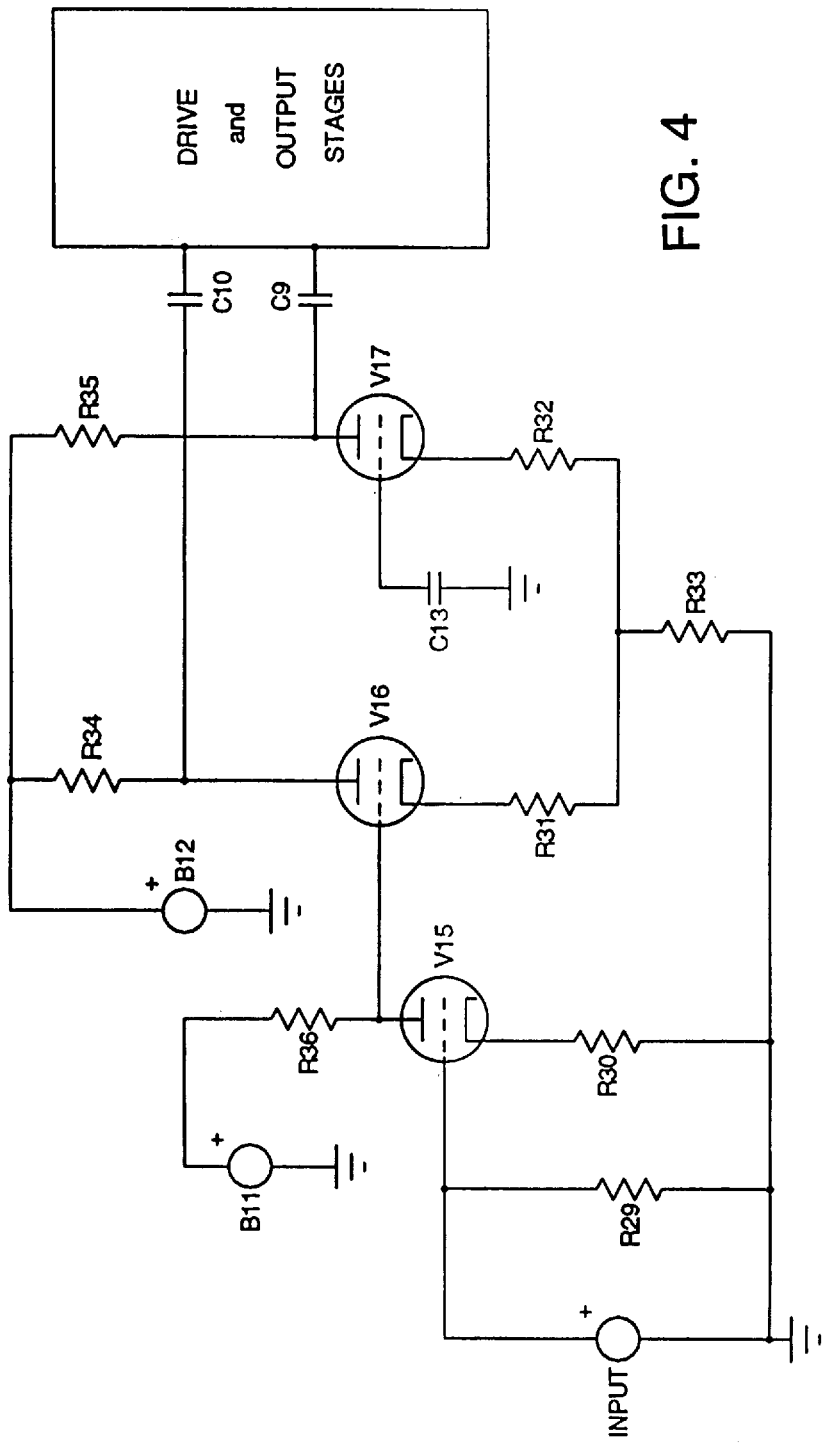
FIG. 4 is a circuit diagram showing an input stage and a long-tailed pair phase splitter stage for generating the oppositely-phased signals for driving the drive stages and push-pull output stage of the push-pull amplifier circuit of FIG. 3.

Referring now to FIG. 4 in more detail, there are shown said input stage and phase splitter stage. The input stage comprises a common-cathode connected triode V15 having its grid driven by an input signal source indicated by the symbol INPUT. A grid leak resistor R29 extends from the grid to ground. A cathode resistor R30 extends from the cathode to ground. A load resistor R36 has one end connected to the plate of triode V15 and its opposite end connected to a first power supply terminal B11.

The phase splitter stage comprises a pair of triodes V16, V17 having bias balancing resistors R31, R32 each connected to a respective cathode and both connected to one end of a current source resistor R33 having its other end grounded. The plate of input triode V15 is direct-coupled to the grid of triode V16 of the phase-splitter stage. The grid of triode V17 is a.c.-coupled to ground by capacitor C13. Plate load resistors R34, R35 each have one end connected to a respective plate of triodes V16, V17 and an opposite end connected to a second power supply terminal B12. The two oppositely-phased signals at the plates of triodes V16, V17 are transmitted to the drive and output stages, described above with respect to FIG. 3, by respective coupling capacitors C9, C10.

Figure 8:
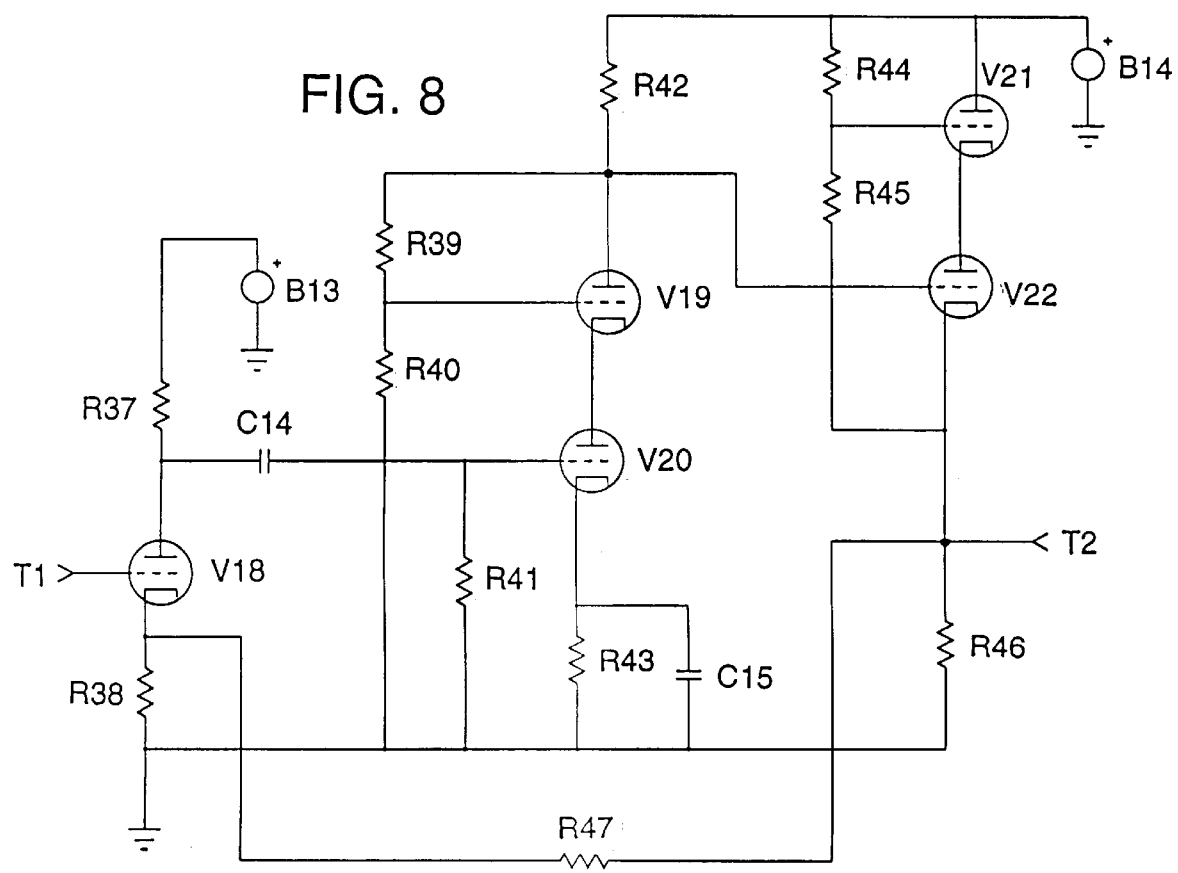
FIG. 8 is a circuit diagram showing a modified embodiment having an additional series-connected cathode-follower stage in cascade between the drive and output stages of the embodiments of FIGS. 1 to 4.

Referring now to FIG. 8, there is shown a modified embodiment wherein an additional series-connected cathode-follower stage is in cascade between the drive and output stages of the embodiments of FIGS. 1 to 4. A predrive stage triode V18 has its grid driven by a signal at T1 symbolizing a connection to the output node of a preceding input stage, such as the plate of triode V4 and the coupling capacitor C4 of FIG. 2. Triode V18 is provided with a cathode bias resistor R38 extending to ground, and a plate load resistor R37 extending to a power supply terminal B13, similar to that described above with respect to the predrive stage triode V5 of FIG. 2. The drive stage of FIG. 8 is the same as the drive stage of FIGS. 1 to 4 and comprises series-connected triodes V19, V20. The grid of the lower triode V20 is provided with a conventional grid leak resistor R41, and its cathode is provided with a conventional cathode bias resistor R43 bypassed by a capacitor C15. The grid of the upper triode V19 is driven by a voltage divider network comprising series-connected resistors R39, R40 driven by the plate of the upper drive triode V19. A plate load resistor R42 extends from the plate of the upper triode V19 to a second power supply terminal B14.

T2 symbolizes a connection to the input node of a single-ended cathode-follower output stage, such as coupling capacitor C2 connected to the grid of output triode V3 in FIG. 1, or coupling capacitor C7 connected to the grid of output triode V8 in FIG. 2. Interposed in cascade between drive stage V19, V20 and said output stage of FIG. 1 or FIG. 2 is a series-connected cathode-follower drive stage comprising triodes V21 and V22. The lower triode V22 has its grid driven by the signal at the plate of the preceding drive stage triode V19 to which said grid is direct-coupled as shown. The plate of the lower triode V22 is connected to the cathode of the upper triode V21. The cathode of the lower triode V22 is connected to the upper end of a cathode load resistor R46 having its lower end connected to ground. The output signal of the cathode-follower stage is taken from the cathode of the lower triode V22 so as to drive the grid of the output stage tube V3 in FIG. 1 or V8 in FIG. 2.

The grid of the upper triode V21 is driven by a voltage divider network comprising a first resistor R45 extending from the cathode of the lower triode V22 and a second resistor R44 extending from the power supply terminal B14. The respective resistances of resistors R44, R45 are approximately equal so that the triodes V21, V22 share both the quiescent voltage and dynamic voltage swing of the series-connected cathode-follower drive stage. That is, the plate-to-cathode voltage of the lower triode V22 is maintained approximately equal to that of the upper triode V21 as the voltage of the output node T2 at the cathode of triode V22 swings up and down through the large amplitudes required to drive the grid of the following output stage of FIG. 1 or FIG. 2.

The advantages of the added cathode-follower drive stage V21, V22 are several. The output impedance at the cathode of triode V22 is substantially lower than that at the plate of triode V19, thereby providing an improved drive signal to the grid of the power output triode V3 (FIG. 1) or V8 (FIG. 2). This lower output impedance also provides an improved drive signal for the feedback network R47. The latter, if too low an impedance and if driven by the plate of drive triode V19, would load down the output signal at the plate of drive triode V19 and thereby increase the distortion in the drive stage V19, V20. Furthermore, the input capacitance at the grid of the relatively small triode V22 is substantially less than at the grid of the relatively large power output triode V3 or V8, and therefore is easier for the triode V19 to drive at high frequencies.

Figure 9:
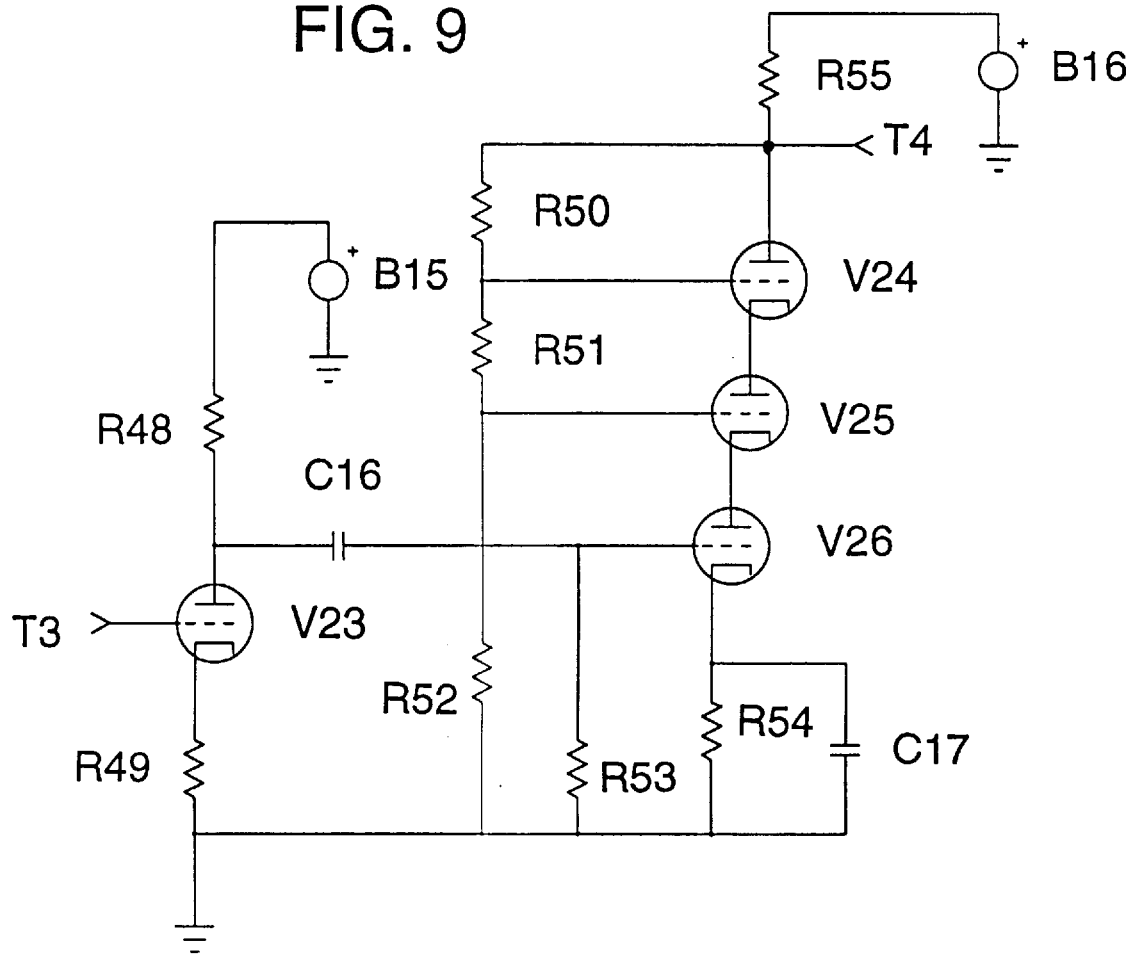
FIG. 9 is a circuit diagram showing another modification wherein the drive stage comprises three series-connected tubes rather than merely two tubes as in the other embodiments.

Referring now to FIG. 9, there is shown a modified embodiment wherein the drive stage comprises three series-connected triodes rather than merely two triodes as in the other embodiments. This enables an increased total voltage swing of the drive stage output signal and/or a reduction of the distortion in the drive stage.

More specifically, a predrive stage triode V23 has its grid driven by a signal at T3 symbolizing a connection to the output node of a preceding input stage, such as the plate of triode V4 and the coupling capacitor C4 of FIG. 2. Triode V23 is provided with a cathode bias resistor R49 extending to ground, and a plate load resistor R48 extending to a power supply terminal B15, similar to that described above with respect to the predrive stage triode V5 of FIG. 2. The drive stage of FIG. 9 is the same as the drive stage of FIGS. 1 to 4 except that it comprises three series-connected triodes V24, V25, V26. The grid of the lower triode V26 is provided with a conventional grid leak resistor R53, and its cathode is provided with a conventional cathode bias resistor R54 bypassed by a capacitor C17. The respective grids of the middle triode V25 and the upper triode V24 are driven by a voltage divider network comprising series-connected resistors R50, R51, R52 driven by the plate of the upper drive triode V24. A plate load resistor R55 extends from the plate of the upper triode V24 to a second power supply terminal B16. The respective resistances of resistors R50, R51, R52 are approximately equal so that the triodes V24, V25, V26 share both the quiescent voltage and dynamic voltage swing of the series-connected drive stage. That is, the respective plate-to-cathode voltages of triodes V24, V25, V26 are maintained approximately equal as the voltage of the output node T4 at the plate of triode V24 swings up and down through the large amplitudes required to drive the grid of the following output stage of FIG. 1 or FIG. 2.

Although for simplicity and clarity in illustration there are shown passive resistors for the plate load impedances R4, R10, R13, R16, R27, R28, R37, R42, R48 and R55, it will be understood that any of these plate load impedances may be implemented instead in the form of an active current source, or variations thereof such as a mu-follower circuit or SRPP circuit, as disclosed by Kelly (Ref. 6). Similarly, this reference shows how a cathode load impedance such as R46 of FIG. 8 may be implemented by an active circuit such as a White cathode-follower.

It should be further understood that the several embodiments shown in the drawings and described in this specification are merely illustrative of several of the many forms which the invention may take in practice without departing from the scope of the invention as delineated in the appended claims which are to be construed as broadly as permitted by the prior art.

BIBLIOGRAPHY

1. Partridge, N., "Distortion in Transformer Cores", *The Wireless World*, Jun. 22, 1939, Jun. 29, 1939, Jul. 6, 1939, Jul. 13, 1939.
2. Hodgson, T., "Single-Ended Amplifiers, Feedback and Horns: Some History", *Sound Practises*, Spring 1994, Pp. 39–42.
3. Langford-Smith, F., *Radiotron Designer's Handbook*, Fourth Edition, Wireless Press, 1952, Pp. 214–217, 229–233, 596.
4. Gilson, M. D. and Pavlat, R., "A Practical Cathode-Follower Audio Amplifier", *Audio Engineering*, May 1949, Pp. 9 et seq.
5. Crowhurst, Norman H., *Understanding Hi-Fi Circuits*, Gernsback Library, 1957, P. 28.
6. Kelly, Mark, "The Search for Linearity", *Glass Audio*, Vol. 8, No. 6, 1996, P. 42; Vol. 9, No. 1, 1997, P. 32.

I claim:

1. A high-fidelity vacuum tube power amplifier for driving a loudspeaker to provide music reproduction without audible distortion, said amplifier comprising at least one drive stage including at least two vacuum tube triodes each having a grid, a plate and a cathode, said plate of a first of said drive stage triodes being connected in series to the cathode of a second of said drive stage triodes so as to provide a common plate-to-cathode current through both triodes, a ground, said first drive stage triode cathode being connected to said ground, a power supply having at least two supply terminals, a load impedance connected between a first of said supply terminals and said second drive stage triode plate, a voltage divider including at least two impedances, a first of said voltage divider impedances being connected between the plate and grid of said second drive stage triode, a second of said voltage divider impedances being connected between said second drive stage triode grid and said ground, means for connecting said drive stage triode grid to a signal source, a cathode-follower output stage including at least one vacuum-tube power output triode having a grid, a plate and a cathode, said second drive stage triode plate being drivingly connected to said power output triode grid, said power output triode plate being connected to a second of said supply terminals, an output transformer having a primary winding and a secondary winding, said power output triode cathode being connected to said transformer primary winding, an output terminal for connection to a loudspeaker, and said transformer secondary winding being connected to said output terminal, whereby said drive stage triodes share the total dynamic output voltage swing of the drive stage when amplifying a signal so as to provide with low distortion a large voltage swing required to drive the cathode-follower power output triode.

2. An amplifier as set forth in claim 1 wherein said output transformer primary winding is connected to said power output triode cathode at one end of said primary winding and the opposite end of said primary winding is connected to said ground whereby said power output triode operates in a single-ended mode, and means for biasing said power output triode for Class A operation with said power output triode remaining conductive throughout its cycle of voltage swing.

3. An amplifier as set forth in claim 2 wherein
said signal source connecting means comprises a predrive stage including a vacuum tube having a cathode and a plate,
means connecting said predrive stage tube plate to the grid of said first drive stage triode,
a resistor connected between said predrive stage tube cathode and said ground, and
a feedback network having one end connected to said power output triode cathode and another end connected to said predrive stage tube cathode.

4. An amplifier as set forth in claim 3 wherein
said signal source connecting means further comprises an input stage including a vacuum tube having a cathode and a plate,
said input tube plate being connected to the grid of said predrive stage tube,
a resistor connected between said input stage tube cathode and said ground, and
an outer feedback network extending from said output transformer secondary winding to said input stage tube cathode.

5. An amplifier as set forth in claim 1 wherein
said signal source connecting means comprises a predrive stage including a vacuum tube having a cathode and a plate,
said predrive stage tube plate being connected to the grid of said first drive stage triode,
a resistor connected between said predrive stage tube cathode and said ground, and
a feedback network connected to said predrive stage tube cathode for transmitting thereto a feedback signal.

6. An amplifier as set forth in claim 1 and comprising
a second drive stage including at least two vacuum-tube triodes each having a grid, a plate and a cathode,
said plate of a first triode of said second drive stage being connected to the cathode of a second triode of said second drive stage,
said cathode of said first triode of said second drive stage being connected to said ground,
a load impedance connected between said first supply terminal and said plate of said second triode of said second drive stage,
a second voltage divider including at least two impedances,
a first impedance of said second voltage divider being connected between the plate and grid of said second triode of said second drive stage,
a second impedance of said second voltage divider being connected between the grid of said second triode of said second drive stage and said ground,
means for connecting the grid of said first triode of said second drive stage to said signal source to transmit thereto a signal having a phase opposite to that of the signal transmitted to the grid of the first triode of said first-recited drive stage,
said cathode-follower output stage including at least another vacuum-tube power output triode having a grid, a plate and a cathode,
the plate of said second triode of said second drive stage being drivingly connected to the grid of said another power output triode,
the plate of said second power output triode being connected to said second supply terminal,
said output transformer primary winding having opposite ends and a center tap connected to said ground,
each of said power output triode cathodes being connected to a respective end of said transformer primary winding, and
a phase-splitting stage to transmit respective oppositely-phased signals to the grids of said first triodes of said two drive stages,
whereby said amplifier operates in a push-pull mode.

7. A high-fidelity vacuum-tube power amplifier for driving a loudspeaker to provide music reproduction with minimal audible distortion, said amplifier comprising
a signal input terminal,
a power supply having a supply terminal,
at least one drive stage including at least two vacuum tubes connected in series,
a first of said drive tubes having an input electrode,
a second of said drive tubes having an input electrode and an output electrode,
a load impedance connected between said supply terminal and the output electrode of said second drive tube,
circuit means connecting said first drive tube input electrode to said input terminal,
signal responsive means connecting said input and output electrodes of said second drive tube for driving the second drive tube so as to cause the respective varying voltages across the drive tubes to remain approximately equal in response to an input signal to said first drive tube input electrode,
a cathode-follower output stage including at least one power output tube having a grid and a cathode,
said second drive tube output electrode being drivingly connected to said output tube grid,
an output transformer having a primary winding and a secondary winding,
said output tube cathode being connected to said transformer primary winding,
an output terminal for connection to a loudspeaker, and
said transformer secondary winding being connected to said output terminal,
whereby said series-connected drive tubes share the dynamic output voltage swing of the drive stage when amplifying a signal so as to provide a substantially undistorted large voltage swing required to drive the cathode-follower output stage.

8. An amplifier as set forth in claim 7 wherein said signal responsive responsive means comprises
a voltage divider network to maintain the voltage at the input electrode of said second drive stage tube approximately midway between the voltage at the output electrode of said second drive stage tube and the ground voltage.

9. An amplifier as set forth in claim 8 and comprising
a ground,
said output transformer primary winding being connected to said output tube cathode at one end of said winding and the opposite end of said winding being connected to said ground whereby said output tube operates in a single-ended mode, and
means for biasing said output tube for Class A operation with said output tube remaining conductive throughout its cycle of voltage swing.

10. An amplifier as said forth in claim 9 and comprising a predrive stage including a vacuum tube having a grid, a cathode and a plate, circuit means connecting said predrive stage tube grid to said input terminal, said first drive tube having a grid said predrive stage tube plate being connected to the grid of said first drive tube, a resistor connected between said predrive stage tube cathode and said ground, and a feedback network having one end connected to said output tube cathode and its opposite end connected to said predrive stage tube cathode.

11. An amplifier as set forth in claim 7 and comprising at least one predrive stage including a vacuum tube having a grid, a cathode and a plate, circuit means connecting said predrive stage tube grid to said input terminal, said first drive tube having a grid, said predrive stage tube plate being connected to the grid of said first drive tube, a resistor connected between said predrive stage tube cathode and said ground, and a feedback network connected to said predrive stage tube cathode for transmitting a feedback signal thereto.

12. An amplifier as set forth in claim 7 and comprising a second drive stage including at least two vacuum tubes connected in series, a first tube of said second drive stage having an input electrode, a second tube of said second drive stage having an input electrode and an output electrode, a second load impedance connected between said supply terminal and the output electrode of said second drive tube of said second drive stage, second signal responsive means connecting said input and output electrodes of said second tube of said second drive stage for driving said second tube in response to a signal to said input electrode of said first tube of said second drive stage, said cathode-follower output stage including at least a second power output tube having a grid and a cathode, a ground, said transformer primary winding having opposite ends and a center tap connected to said ground, each of said power output tube cathodes being connected to a respective opposite end of said transformer primary winding, whereby said amplifier operates in a push-pull mode.

13. A vacuum tube amplifier comprising a drive stage including at least two tubes each having a grid, a cathode and a plate, said tubes being connected in series with the plate of a first tube connected to the cathode of a second tube so that a common plate-to-cathode current flows through the tubes in series, means for transmitting a signal to the grid of the first tube, a ground connected to the cathode of said first tube, a load impedance connected to the plate of said second tube, a voltage divider network connecting said plate and grid of said second tube to maintain the respective plate-to-cathode voltages of said tubes approximately equal as the plate voltage of said second tube swings up and down during the amplification of said signal, a cathode-follower output stage, and means drivingly connecting the plate of said second tube to said cathode-follower output stage.

14. An amplifier as set forth in claim 13 wherein said voltage divider network comprises series-connected impedances having values to maintain the voltage at the grid of said second drive stage tube approximately midway between the voltage at the plate of said second drive stage tube and the ground voltage.

15. An amplifier as set forth in claim 14 wherein said voltage divider network comprises a first impedance connected between said plate and grid of said second tube, and a second impedance connected between said grid of said second tube and said ground.

16. An amplifier as set forth in claim 15 and comprising an output transformer having a primary winding connected to said output stage at one end of said winding and the opposite end of said winding being connected to said ground whereby said output tube operates in a single-ended mode, and means for biasing said output tube for Class A operation with said output tube remaining conductive throughout its cycle of voltage swing.

17. An amplifier as set forth in claim 16 and comprising a predrive stage including a vacuum tube having a cathode and a plate, said predrive stage tube plate being connected to the grid of said first drive tube, a resistor connected between said predrive stage tube cathode and said ground, and a feedback network extending from said output stage to said predrive stage tube cathode.

18. An amplifier as set forth in claim 17 and comprising an input terminal, an input stage including a vacuum tube having a grid, a cathode and a plate, said input tube grid being connected to said input terminal, said input tube plate being connected to the grid of said predrive stage tube, a resistor connected between said input tube cathode and said ground, and an output terminal for connection to a loudspeaker, said output transformer having a secondary winding connected to said output terminal, and an outer feedback network extending from said output terminal to said input tube cathode.

19. An amplifier as set forth in claim 13 and comprising a predrive stage including a vacuum tube having a cathode and a plate, said predrive stage tube plate being connected to the grid of said first drive tube, a resistor connected between said predrive stage tube cathode and said ground, and a feedback network connected to said predrive stage tube cathode for transmitting thereto a feedback signal.

20. An amplifier has set forth in claim 13 and comprising a second drive stage including at least two tubes each having a grid, a plate and a cathode, said tubes of the second drive stage being connected in series with the plate of a first tube connected to the cathode of a second tube so that a common quiescent plate-to-cathode current flows through the tubes in series, means for transmitting a second signal to the grid of the first tube of the second drive stage, said second signal being a replication of said first-recited signal but oppositely phased with respect thereto, the cathode of said first tube of the second drive stage being connected to said ground, a load impedance connected to the plate of said second tube of the second drive stage, a second voltage divider network connecting said plate and grid of said second tube of the second drive stage to maintain the respective plate-to-cathode voltages of said tubes approximately equal as the plate voltage of said second tube of the second drive stage swings up and down during amplification of said signal, said cathode-follower output stage having at least two power output tubes each having a cathode, an output transformer including a primary winding having each of its opposite ends connected to a respective one of said power output tube cathodes, and a phase-splitting stage to generate said respective oppositely-phased signals for transmission to the respective grids of said first tubes of said two drive stages, whereby said amplifier operates in a push-pull mode.

* * * * *